United States Patent
Akiyama

(10) Patent No.: US 7,280,272 B2
(45) Date of Patent: Oct. 9, 2007

(54) BIAS CONTROL OF SOA VIA SWITCHES

(75) Inventor: Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/230,629

(22) Filed: Sep. 21, 2005

(65) Prior Publication Data
US 2006/0215255 A1 Sep. 28, 2006

(30) Foreign Application Priority Data
Mar. 25, 2005 (JP) .............................. 2005-088527

(51) Int. Cl.
*H01S 3/00* (2006.01)
(52) U.S. Cl. ..................................... 359/344
(58) Field of Classification Search ................. 359/344
See application file for complete search history.

(56) References Cited

U.S. PATENT DOCUMENTS

| | | | | |
|---|---|---|---|---|
| 6,133,807 A * | 10/2000 | Akiyama et al. | ........... | 333/101 |
| 6,429,729 B2 * | 8/2002 | Kobayashi et al. | ......... | 327/540 |
| 6,452,259 B2 * | 9/2002 | Akiyama | ..................... | 257/686 |
| 6,597,497 B2 * | 7/2003 | Wang et al. | ................. | 359/344 |
| 6,611,051 B2 * | 8/2003 | Akiyama et al. | ........... | 257/685 |
| 6,714,344 B2 * | 3/2004 | Islam et al. | ................... | 359/344 |
| 6,747,793 B1 * | 6/2004 | Flanders | ...................... | 359/344 |
| 6,822,787 B1 * | 11/2004 | DiJaili et al. | ................ | 359/344 |
| 6,853,063 B2 * | 2/2005 | Akiyama et al. | ........... | 257/685 |
| 7,091,588 B2 * | 8/2006 | Akiyama et al. | ........... | 257/685 |
| 2005/0232044 A1 * | 10/2005 | Akiyama et al. | ........... | 365/207 |
| 2006/0215255 A1 * | 9/2006 | Akiyama | ..................... | 359/344 |

FOREIGN PATENT DOCUMENTS

| | | |
|---|---|---|
| EP | 0 746 067 | 12/1996 |
| EP | 0 841 733 | 5/1998 |
| WO | WO 03/032036 | 4/2003 |

OTHER PUBLICATIONS

L.J. Christiansen, et al.; "2R Regeneration in Concatenated Semiconductor Optical Amplifiers and Electroabsorbers;" *European Conference on Optical Communications*; Sep. 2004; 2 Sheets./Discussed in the specification.
F. Öhman, et al.; "Semiconductor Devices for All-Optical Regeneration;" *ICTON 2003*; We.B.4; 2003; pp. 41-46./Discussed in the specification.
European Search Report dated Feb. 28, 2006, 7 pages).
Patent Abstracts of Japan, vol. 14, No. 263, Jun. 7, 1990, JP 02 082681, Mar. 23, 1990.

* cited by examiner

*Primary Examiner*—Deandra M Hughes
(74) *Attorney, Agent, or Firm*—Kratz, Quintos & Hanson, LLP

(57) ABSTRACT

A semiconductor device, comprising a semiconductor stacking body configured so as to sandwich an active layer by a p-type semiconductor layer and an n-type semiconductor layer and having plural regions along the active layer, plural electrodes provided on the p-type semiconductor layer or the n-type semiconductor layer and provided one for each of the plural regions, and a switch operatively connected to at least one of the plural electrodes for switching bias voltage application directions, is configured such that each of the plural regions is forward biased by a voltage applied via the electrode and becomes an amplification region when the switch is turned to one side, and is backward biased by a voltage applied via the electrode and becomes an attenuation region when the switch is turned to the other side.

15 Claims, 8 Drawing Sheets

BIAS CONTROL OF SOA VIA SWITCHES

CROSS REFERENCE TO RELATED APPLICATIONS

This application is based on and hereby claims priority to Japanese Application No. 2005-088527 filed on Mar. 25, 2005 in Japan, the contents of which are hereby incorporated by reference.

BACKGROUND OF THE INVENTION (1) Field of the Invention

The present invention relates to a semiconductor device suitable for use in a semiconductor optical amplifier applicable to, for example, an optical communication system.

(2) Description of the Related Art

Following the recent increasing demand for communication, the wavelength division multiplexing communication system (WDM communication system) is being developed, which will enable large-capacity transmission through one optical fiber by multiplexing plural signal light waves of different wavelengths.

As an optical amplifier used in such an optical communication system, a semiconductor optical amplifier (SOA) having a wide wavelength band, compact, and capable of a low-power consuming operation is a promising one.

On the other hand, the application range of a large-capacity, high-speed photonic network is spreading to a metro access system close to subscribers. A photonic network applied to a metro access system has a flexible network configuration using an optical add drop multiplexer (OADM) etc.

An optical amplifier used in such a network system is required to be capable of carrying out an automatic gain control (AGC) and/or an automatic power control (APC) against the variations in the number of wavelengths to be multiplexed and the variations in the intensity of light to be input.

L. J. Christiansen et al. "2R Regeneration in Concatenated Semiconductor Optical Amplifiers and Electroabsorbers." European Conference on Optical Communications, September 2004 (hereinafter, referred to as Document 1) and Filip Ohman et al. "Semiconductor Devices for All-Optical Regeneration" ICTON 2003, We. B. 4, p. 41-46 (hereinafter, referred to as Document 2) have disclosed a proposal that an optical amplification region (SOA) and an electric field absorption region (EA; electro-absorber) are provided and the SOA is used under forward bias and the EA is used under backward bias.

SUMMARY OF THE INVENTION

By the way, in order to carry out an automatic gain control and/or an automatic power control, a variable attenuator and a power monitor are required, however, if these devices are prepared as individual components and these individual components and an optical amplifier are connected with an optical fiber, the cost is raised.

Therefore, in order to reduce the cost, it suggests itself to integrate such devices for realizing automatic gain and output power controls into a semiconductor optical amplifier.

First, as shown in FIG. 8 for example, it suggests itself to integrate a semiconductor optical amplifier 100 and a semiconductor laser 101. In other words, as shown in FIG. 8 for example, the semiconductor optical amplifier 100, the semiconductor laser 101, an input optical waveguide 102 for guiding input signal light to the semiconductor optical amplifier 100, an optical waveguide 103 for guiding the gain control light (the laser oscillation light for gain control) output from the semiconductor laser 101, and a coupler 104 for connecting the input optical waveguide 102 and the control optical waveguide 103 are integrated. Due to this, it is made possible to reduce gain by inputting laser oscillation light for gain control into the semiconductor optical amplifier 100 that amplifies input signal light and causing a gain saturation by stimulated emission of the laser oscillation light for gain control. In other words, it becomes possible to control gain and power by controlling the power of laser oscillation light for gain control (hereinafter, referred to as a first method).

As shown in FIG. 9, it also suggests itself to integrate the semiconductor optical amplifier 110 and an intensity modulator 111. In other words, as shown in FIG. 9 for example, it is recommended to provide the intensity modulators 111 on the input side and the output side of the semiconductor optical amplifier 110. Due to this, even if the gain by the semiconductor optical amplifier 110 is fixed, it is made possible to control the entire gain and power by changing the amount of light absorbed by the intensity modulator 111 (hereinafter, referred to as a second method).

However, by the above-mentioned first and second methods, the cost can be reduced but loss of input signal light is produced before the input signal light reaches the optical amplifier and it is difficult to reduce such loss. For example, by the above-mentioned first method, power loss is produced in the input signal light owing to the loss by the optical waveguide and the coupler. By the above-mentioned second method, power loss is produced in the input signal light owing to the insertion loss of the intensity modulator.

As described above, although it is possible to reduce the cost by integration, a loss of the input signal light is increased, therefore, the noise figure is increased and the noise characteristic is deteriorated.

Further, by the above-mentioned first and second methods, a gain control and/or a power control may be carried out, however, it will be difficult to deal with a case where the power of input signal light changes significantly since the devices to be integrated are fixed.

Similarly, by the methods described in the above-mentioned Documents 1 and 2, when the power of input signal light changes significantly, it is difficult to carry out a gain control or a power control in accordance with this since the optical amplification region (SOA) used under the forward bias and the electric field absorption region (EA) used under the backward bias are fixed. For example, if the forward bias voltage applied to the SOA is changed significantly, distortion in waveform is caused to occur. Further, if the backward bias voltage applied to the EA is changed, distortion in waveform is caused to occur before the amount of attenuation changes. Owing to this, a gain control and/or a power control by changing the bias voltage can be carried out only in the range in which no distortion in waveform is caused to occur, resulting in being insufficient for practical use.

Particularly, when the power of input signal light becomes small, if the gain control and/or the power control are not sufficient, the noise characteristic is deteriorated as a result. On the other hand, when the power of input signal light becomes large, if the gain control and/or the power control are not sufficient, distortion in waveform is caused to occur.

The present invention has been developed with these problems being taken into account, and an object thereof is to provide a semiconductor device capable of carrying out an automatic gain control and an automatic power control in accordance with the change in the power of input signal light without causing distortion in waveform and the deterioration of noise characteristic to occur, while making it possible to integrate a semiconductor optical amplifier and devices used for an automatic gain control and/or an automatic power control.

Therefore, in accordance with one aspect of the present invention, a semiconductor device comprises a semiconductor stacking body configured so as to sandwich an active layer by a p-type semiconductor layer and an n-type semiconductor layer and having plural regions along the active layer, plural electrodes provided on the p-type semiconductor layer or the n-type semiconductor layer and provided one for each of the plural regions, and a switch operatively connected to at least one of the plural electrodes for switching bias voltage application directions, wherein each of the plural regions is forward biased by a voltage applied via the electrode and becomes an amplification region when the switch is turned to one side, and is backward biased by a voltage applied via the electrode and becomes an attenuation region when the switch is turned to the other side.

Therefore, according to one aspect of the present invention, an advantage is obtained that it becomes possible to integrate a semiconductor optical amplifier and devices used for an automatic gain control and an automatic power control without causing distortion in waveform and the deterioration of noise characteristic to occur and carry out an automatic gain control and an automatic power control in accordance with the change in the power of input signal light.

DESCRIPTION OF THE PREFERRED EMBODIMENTS

A semiconductor device according to embodiments of the present invention is described below with reference to FIG. 1 to FIG. 7.

Figure 1:
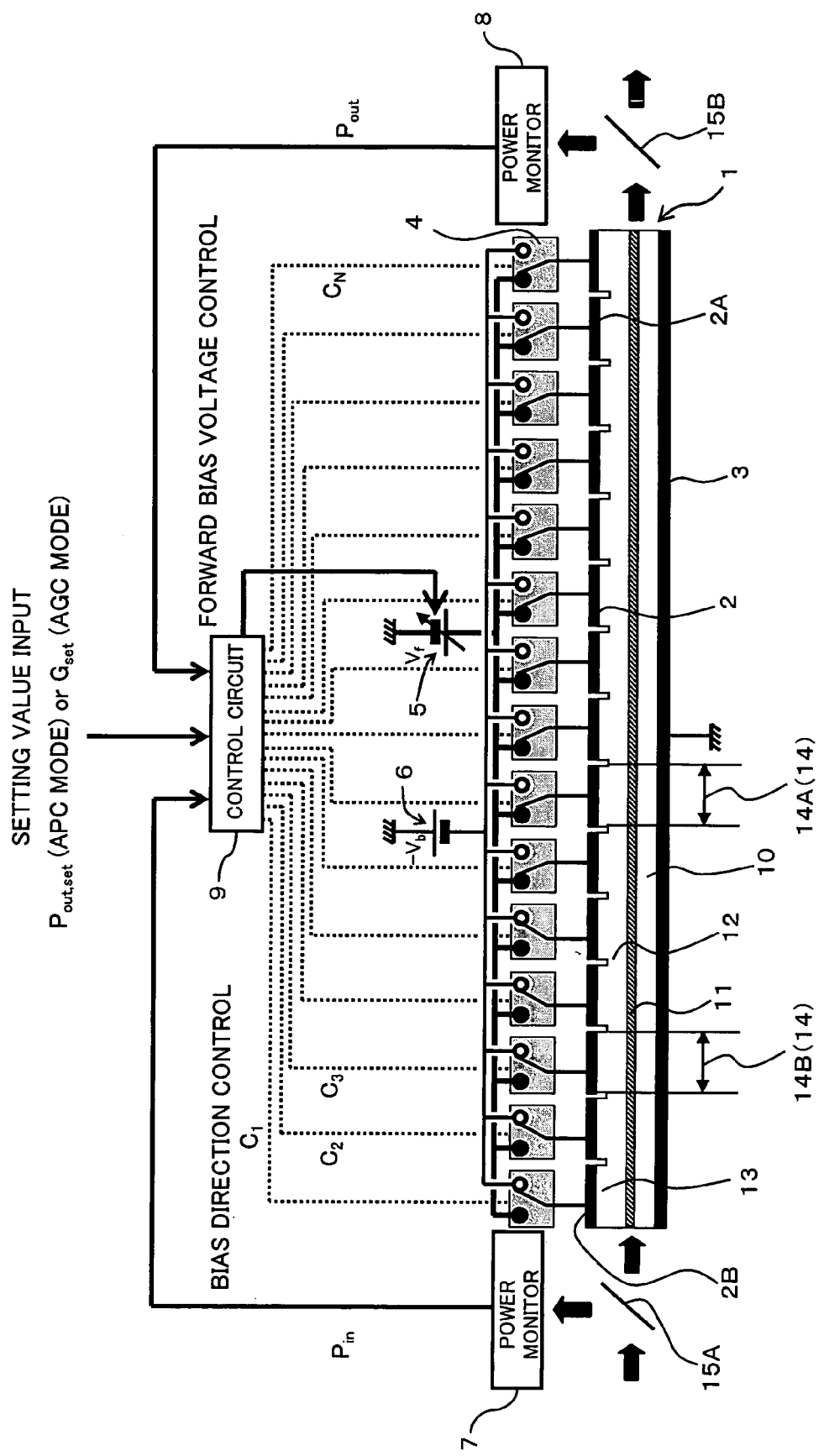
FIG. 1 is a schematic diagram showing a configuration of a semiconductor device according to an embodiment of the present invention.

As shown in FIG. 1, a semiconductor device (semiconductor optical amplifier) according to the present invention comprises a semiconductor stacking body 1 including an n-type semiconductor layer 10, an active layer 11, and a p-type semiconductor layer 12, plural p-side electrodes (discrete electrodes) 2 and an n-side electrode (common electrode) 3 formed on the surfaces of the semiconductor stacking body 1, plural switches 4 connected to each of the plural p-side electrodes 2, a forward bias power source 5 and a backward bias power source 6 connected to the plural switches 4, an input power monitor 7 for monitoring the power (input power) of input signal light (input light), an output power monitor 8 for monitoring the power (output power) of output signal light (output light), and a control circuit (a gain control circuit, an output power control circuit) 9 for carrying out an automatic gain control and an automatic power control.

Figure 2:
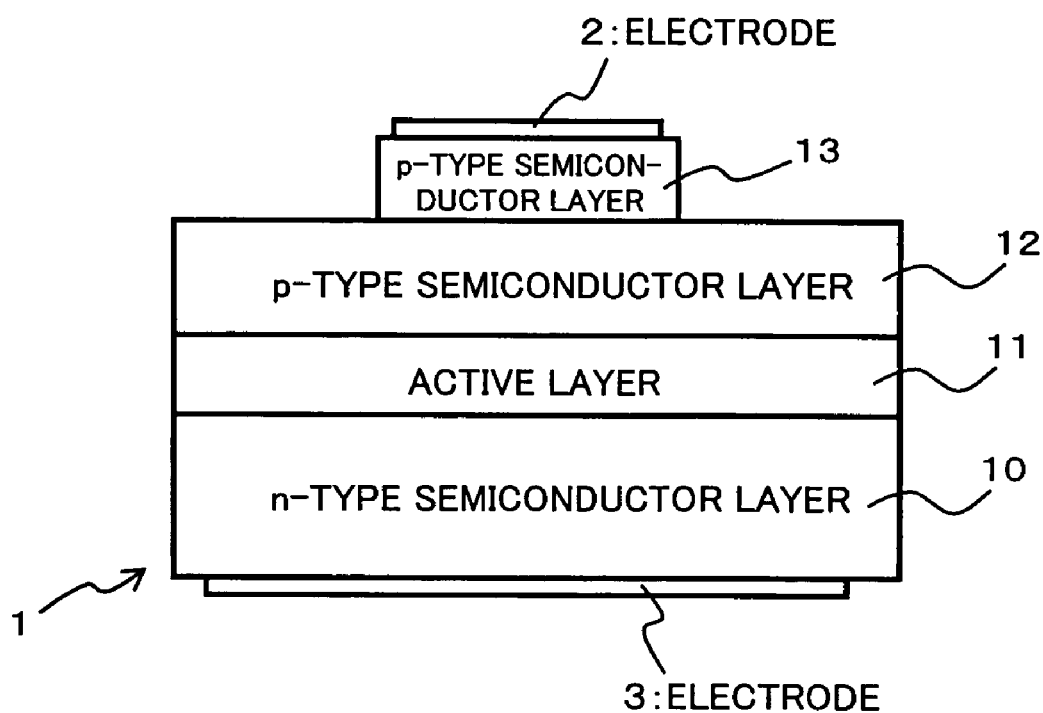
FIG. 2 is a schematic section view showing a configuration of a semiconductor stacking body of a semiconductor device according to an embodiment of the present invention.

Here, as shown in FIG. 2, the semiconductor stacking body 1 has a structure in which the n-type semiconductor layer 10 (for example, an n-type semiconductor substrate or an n-type semiconductor buffer layer) and the p-type semiconductor layer 12 (for example, a p-type semiconductor cladding layer) sandwich the active layer 11 (for example, an undoped semiconductor active layer). Here, the semiconductor stacking body 1 is configured so as to include a p-type semiconductor layer 13 (for example, a p-type semiconductor cladding layer or a p-type semiconductor contact layer) formed on the p-type semiconductor layer 12. The structure (ridge type structure) of the semiconductor stacking body 1 is not limited to this but may be a buried type or a high mesa type.

The semiconductor stacking body 1 also has a function as an optical waveguide. In other words, the p-type semiconductor layer 12 and the p-type semiconductor layer 13, the n-type semiconductor layer 10, and the active layer 11 are configured so as to function as an upper side cladding layer, a lower side cladding layer, and a waveguide core layer, respectively. On both end faces of the semiconductor stacking body 1, for example, a reflection-reducing structure such as an anti-reflective coat, an oblique end face, or a window structure is provided.

When a forward bias is applied to the semiconductor stacking body 1 configured as described above, a current is injected into the active layer 11, a gain is produced, and signal light input into the active layer 11 is amplified as a result. In other words, when a forward bias is applied to the semiconductor stacking body 1, it functions as an amplifier.

On the other hand, when a backward bias is applied to the semiconductor stacking body 1, the signal light input into the active layer 11 is absorbed as a result. In other words, when a backward bias is applied to the semiconductor stacking body 1, it functions as an attenuator.

Here, the p-side electrodes 2 are provided on the p-type semiconductor layer 13 and the n-side electrode 3 is provided on the backside of the n-type semiconductor layer 10 (backside of the n-type semiconductor substrate).

Particularly, in the present embodiment, the electrodes (here, the p-side electrodes 2) on one side have a multi-electrode structure, in which the plural p-side electrodes 2 are provided in series along the active layer 11 on the semiconductor stacking body 1. Because of this, the semiconductor stacking body 1 is divided into plural regions 14 in series along the active layer 11. In other words, in the present embodiment, the p-side electrodes 2 are provided one for each of the plural regions 14 of the semiconductor stacking body 1. Then, it is made possible to apply a forward bias voltage $V_f$ or a backward bias voltage $-V_b$ to each of the plural regions 14 independently from each other.

The respective switches 4 are connected to the respective plural p-side electrodes 2, having a function of switching the applied directions (forward direction bias or backward direction bias) of the voltage to be applied to the respective regions 14 of the semiconductor stacking body 1. For example, the switch 4 is constituted of transistors.

Here, one of the input terminals of each of the switches 4 is connected to the forward bias power source 5 and the other input terminal is connected to the backward bias power source 6, and the output terminal is connected to the p-side electrode 2. In other words, due to the switch 4, it is made possible to select either of the forward bias power source 5 and the backward bias power source 6. The plural switches 4 are each connected to the common forward bias power source 5 and the common backward bias power source 6.

Then, when the switch 4 is turned to one of the input terminals, the forward bias voltage $V_f$ is applied to one of the regions 14 constituting the semiconductor stacking body 1 via the p-side electrode 2.

In this manner, in the region 14 to which the forward bias is applied, a gain is produced and the signal light is amplified, and thus the region functions as an amplifier. Hereinafter, when the forward bias voltage $V_f$ is applied to the p-side electrode 2, the p-side electrode 2 is called a forward bias electrode 2A. The region functioning as an amplifier is called an amplification region 14A.

On the hand, when the switch 4 is turned to the other input terminal, the backward bias voltage $-V_b$ is applied to one of the regions 14 constituting the semiconductor stacking body 1 via the p-side electrode 2.

The region 14 to which the backward bias is applied in this manner functions as an attenuator because the signal light is absorbed and attenuated by the electric field absorption effect. Hereinafter, when the backward bias voltage $-V_b$ is applied to the p-side electrode 2, the electrode is called a backward bias electrode 2B. The region functioning as an attenuator is called an attenuation region 14B.

FIG. 1 shows a state in which the five switches 4 from the leftmost one to the fifth one are turned to the backward bias power source 6 side and the sixth and the rest are turned to the forward bias power source 5 side.

Due to the configuration as described above, it becomes possible by turning the switches 4 to apply the backward bias to the regions 14B, which are a part of the semiconductor stacking body 1, via a part of the electrodes 2B to use the regions 14B as an attenuator and to apply the forward bias to the regions 14A, which are the rest of the semiconductor stacking body 1, via the electrodes 2A, which are the rest of the electrodes to use the regions 14A as an amplifier.

Particularly, since it is possible to arbitrarily increase or decrease the number of the backward bias electrodes 2B (or the number of the forward bias electrodes 2A) by turning the switch 4, it becomes possible to change the magnitude of the gain and the output power in a stepwise manner. In other words, since it is possible to change the amount of attenuation (or the amount of amplification) by turning the switch 4 to change the bias direction, it becomes possible to change the magnitude of the gain and the output power in a stepwise manner. This means that it is possible to dynamically change the integration pattern of the amplifiers 14A and the attenuators 14B integrated into a monolithic structure.

Figure 3:
FIG. 3 is a schematic diagram for explaining a bias direction switching pattern in a semiconductor device according to an embodiment of the present invention.

For example, as shown in FIG. 3, on one hand it is possible to use as the amplifier 14A by turning all to the forward bias electrodes 2A and on the other hand, it is also possible to use as the attenuator 14B by turning all to the backward bias electrodes 2B. Further, it is possible to use as one into which the attenuators 14B and the amplifiers 14A are integrated by turning a part to the backward bias electrodes 2B and the rest to the forward bias electrodes 2A. Switching of each electrode pattern can be carried out dynamically.

Here, switching of the electrode pattern can be carried out arbitrarily. Variations of the bias direction switching pattern includes, for example, the following methods.

Figures 4A, 4B, 4C, 4D, 4E:
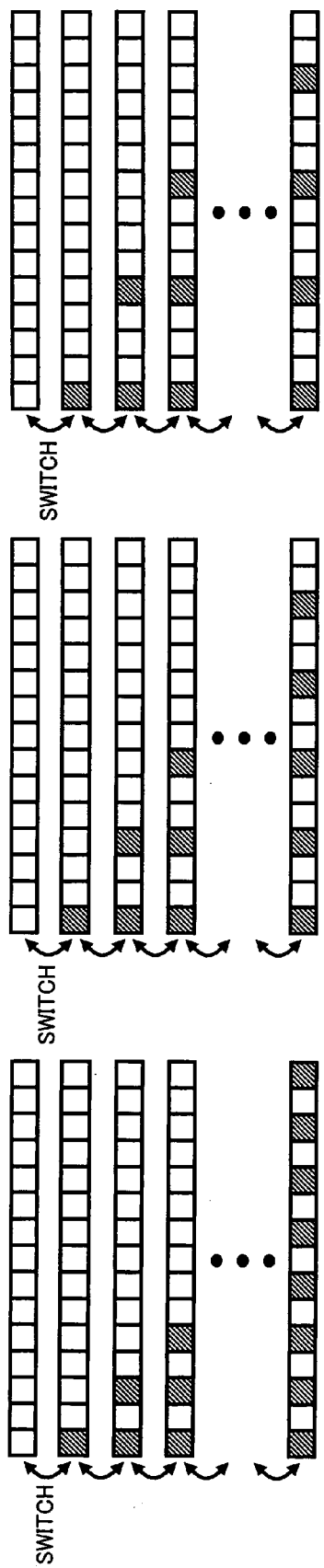
FIG. 4(A) to FIG. 4(E) are schematic diagrams for explaining a bias direction switching pattern in a semiconductor device according to an embodiment of the present invention.

For example, when the number of the backward bias electrodes 2B is increased, there is a method in which the electrode is turned to the backward bias electrode 2B in order from the input side as shown in FIG. 3. Alternatively, as shown in FIG. 4(A), every two electrodes may be turned to the backward bias electrode 2B. Alternatively, as shown in FIG. 4(B), every third electrodes may be turned to the backward bias electrode 2B or every fourth electrodes may be turned to the backward bias electrode 2B as shown in FIG. 4(C). Further, as shown in FIG. 4(D) or FIG. 4(E), the electrode may be turned to the backward bias electrode 2B from an arbitrary position. The position(s) of the backward bias electrode(s) may be changed when the number of the backward bias electrodes 2B is increased.

However, if the number of the backward bias electrodes 2B is increased too large and the power of the signal light falls too low, the deterioration of the noise characteristic is caused to occur. On the other hand, if the number of the backward bias electrodes 2B is decreased too small (the number of the forward bias electrodes is too large) and the power of the signal light rises too high, the distortion in waveform is caused to occur. Because of this, it is necessary to set a bias direction switching pattern that does not cause the deterioration of the noise characteristic and the distortion in waveform to occur.

For example, if the backward bias electrodes 2B exist consecutively, there may be a case where the power of the signal light falls too low temporarily at that portion and the noise characteristic is deteriorated. Because of this, preferably the backward bias electrodes 2B do not exist excessively consecutively. On the other hand, for example, if the forward bias electrodes 2A exist consecutively, there may be a case where the power of the signal light rises too high temporarily at that portion and therefore the distortion in waveform occurs. Because of this, preferably the forward bias electrodes 2A do not exist excessively consecutively. For example, when the amount of amplification and the amount of attenuation in one region are equal, if the switches 4 are set into a state of being turned to opposite sides alternately such that the backward bias electrodes 2B are arranged at every two portions, the power of the signal light changes in a zigzag manner and therefore the power of the signal light can be prevented from rising too high or falling too low.

Particularly, when the power of the input signal light is less than a predetermined value, it is recommended to turn the electrode provided in the region nearest to the input side of the semiconductor stacking body 1 to the forward bias electrode 2A for use as the amplifier 14A. Due to this, it becomes possible to amplify the input signal light before it suffers a power loss and prevent the noise characteristic from deteriorating when the amplifier 14A and the attenuator 14B are integrated. Due to this, it becomes possible to integrate the semiconductor optical amplifier 14A and the device (here, the attenuator 14B) used for automatic gain control and automatic power control.

On the other hand, when the power of the input signal light is greater than the predetermined value, for example, it is possible to prevent the distortion in waveform from occurring by increasing the number of the backward bias electrodes 2B.

Because of this, it becomes possible to permit a larger range of the magnitude of the power of the input signal light and therefore the dynamic range of the input power is enlarged.

In the present embodiment, the forward bias power source 5 is configured as a variable voltage power source capable of variably controlling the bias voltage. Due to this, it is possible to continuously change the magnitude of the forward bias voltage $V_f$ after changing the length of the region to which the forward bias voltage $V_f$ is applied in a stepwise manner by changing the number of the backward bias electrodes 2B by means of turning of the switches 4. In other words, the fine-control of the gain and the output power, which cannot be carried only by changing the number of electrodes, is carried out by changing the forward bias voltage $V_f$ to continuously change the amount of current to be injected. This is because when the forward bias voltage $V_f$ is changed significantly, the distortion in waveform occurs.

On the other hand, the backward bias power source 6 is configured as a fixed voltage power source capable of supplying a fixed voltage as a bias voltage. This is because if the backward bias voltage $-V_b$ is changed, the distortion in waveform occurs more significantly than the amount of attenuation changes.

By the way, the switching control of switches as described above (bias direction control) is carried out based on control signals $C_1, C_2, \ldots, C_N$ from the control circuit 9 to each of the switches 4.

Further, the control circuit 9 also carries out a variable control of the forward bias voltage $V_f$ output from the forward bias power source 5 (forward bias voltage control). In other words, in the present embodiment, the automatic gain control (AGC control mode) and the automatic power control (APC control mode) are carried out by the control circuit 9. The automatic gain control and the automatic power control will be described in detail later.

Due to this, to the control circuit 9, an input power $P_{in}$ monitored by the input power monitor 7 is input. Further, to the control circuit 9, an output power $P_{out}$ monitored by the output power monitor 8 is also input. Then, the control circuit 9 carries out the automatic power control based on the output power $P_{out}$. The control circuit carries out the automatic gain control based on the output power $P_{out}$ and the input power $P_{in}$. By the way, to the control circuit 9, a target output power value $P_{out, set}$ used in the APC control mode and a target gain value $G_{set}$ used in the AGC control mode are set as setting values.

Here, the input power monitor 7 and the output power monitor 8 are configured so as to include a photo-detector, for example.

Here, part of the input signal light input to the semiconductor stacking body 1 that functions as the optical amplifier 14A or the optical attenuator 14B is branched by a coupler 15A and the input power is measured by the input power monitor 7. In other words, the intensity of the input light (monitored light) is detected by the photo-detector including the input power monitor 7 and the input power is measured based thereon.

Further, part of the output signal light output from the semiconductor stacking body 1 that functions as the optical amplifier 14A or the optical attenuator 14B is branched by a coupler 15B and the output power is measured by the output power monitor 8. In other words, the intensity of the output light (monitored light) is detected by the photo-detector including the output power monitor 8 and the output power is measured based thereon.

The photo-detector (for example, a photo-diode) may be integrated on the optical waveguide without providing the couplers 15A and 15B. Then, the control circuit 9 may be configured so as to carry out the automatic gain control and/or the automatic power control based on the intensity of the light detected by the photo-detector. In this case, the photo-detector and the control circuit 9 function as a power monitor (input power monitor, output power monitor).

Next, the automatic power control (APC) at the time of start-up of the semiconductor device according to the present embodiment is described with reference to the flow chart in FIG. 5. Here, a case where the bias voltages are switched as shown in FIG. 3 is described as an example.

Figure 5:
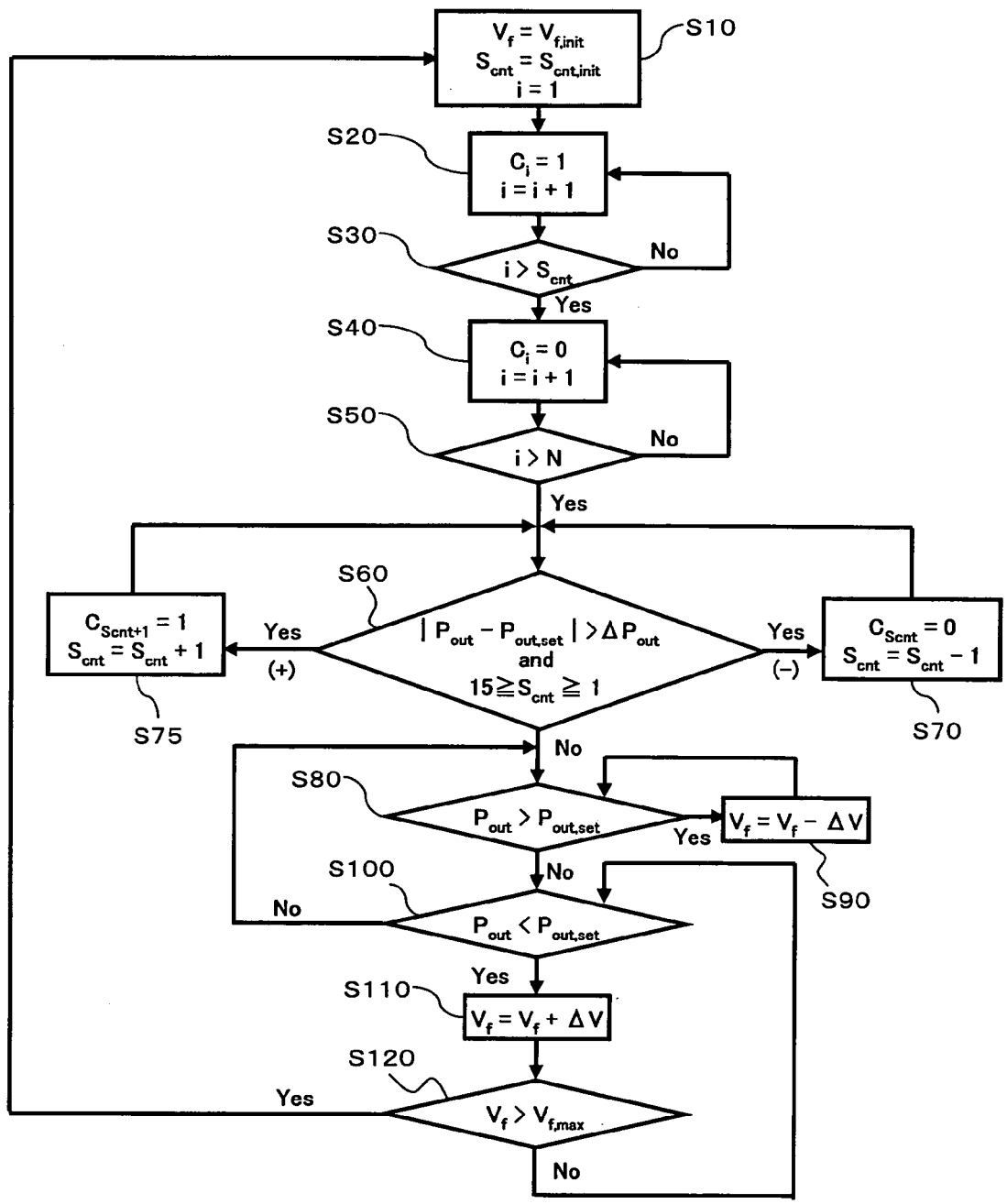
FIG. 5 is a flow chart for explaining an automatic power control in a semiconductor device according to an embodiment of the present invention.

First, as shown in FIG. 5, the control circuit 9 carries out initialization (step S10).

Specifically, the control circuit 9 sets the forward bias voltage $V_f$ output from the forward bias power source 5 to an initial value $V_{f,init}$ ($V_f=V_{f,init}$). The control circuit 9 also sets the number of switches 4 to be turned to the backward bias power source 6 side (the number of backward bias side switches, the number of backward bias electrodes) $S_{cnt}$ to an initial value $S_{cnt,init}$ ($S_{cnt}=S_{cnt,init}$). Here, as an initial state, since the leftmost five switches 4 are turned to the backward bias power source 6 side, a value of "5" is set as the initial value $S_{cnt,init}$. Further, the value of the switch number (electrode number) i is set to "1" (i=1).

Next, the control circuit 9 carries out a control to turn the switch 4 to the initial state (steps S20 to S50).

Specifically, the control circuit 9 first sets control signal $C_i$ to "1" ($C_i=1$) (step S20). When the control signal $C_i$ is set to "1", the control circuit 9 outputs a control signal to cause the switch 4 with switch number i to turn to the backward bias power source 6 side. On the other hand, when the control signal $C_i$ is set to "0", the control circuit 9 outputs a control signal to cause the switch 4 with switch number i to turn to the forward bias power source 5 side.

Here, since the value of switch number i is set to "1" in the above-mentioned step S10, the control signal $C_1$ is set to "1" ($C_1=1$) and the switch 4 with switch number 1 (in FIG. 1, the leftmost switch) is turned to the backward bias power source 6 side.

After this, the control circuit 9 increments the value of switch number i (i=i+1) (step S20). As a result, the value of switch number i becomes "2".

Next, the control circuit 9 judges whether or not the value of switch number i is greater than the number of switches on the backward bias side $S_{cnt}$ (i>$S_{cnt}$) (step S30). Then, when the result of judgment is that the value of switch number i is greater than the number of switches on the backward bias side $S_{cnt}$ "Yes", the process proceeds to step S40. On the other hand, when the result of judgment is that the value of switch number i is equal to or less than the number of switches on the backward bias side $S_{cnt}$ "No", the process returns to step S20 and after this the processes in steps S20 and S30 are repeated until the value of switch number i becomes greater than the number of switches on the backward bias side $S_{cnt}$.

Currently, since the value of switch number i is "2" and that of $S_{cnt,\ init}$ is "5", the judgment result will be "No", therefore, the process returns to step S20. In step S20, since the value of switch number i is "2", the control signal $C_2$ is set to "1" ($C_2$=1) and the switch 4 with switch number 2 (in FIG. 1, the second switch from the left side) is turned to the backward bias power source 6 side. Then the value of switch number i is incremented to "3". The judgment result in step S30 will still be "No" and the process returns to step S20.

After this, the same processes are repeated and the switches up to the switch 4 with switch number 5 (in FIG. 1, the fifth switch from the left side) are turned to the backward bias power source 6 side.

When the value of switch number i is incremented to "6" in step S20, the judgment result will be "Yes" in step S30. In this case, the process proceeds to step S40.

Then, since the value of switch number i is "6", the control circuit 9 sets the control signal $C_6$ to "0" ($C_6$=0) in step S40 and the switch 4 with switch number 6 (in FIG. 1, the sixth switch from the left side) is turned to the forward bias power source 5 side.

After this, the control circuit 9 increments the value of switch number i (i=i+1) (step S40). As a result, the value of switch number i becomes "7".

Next, the control circuit 9 judges whether or not the value of switch number i is greater than the total number of switches (the total number of electrodes) N (set to 15, here) (i>N) (step S50). When the result of judgment is that the value of switch number i is greater than the total number of switches N "Yes", the process proceeds to step S60. On the other hand, when the result of judgment is that the value of switch number i is equal to or less than the total number of switches N "No", the process returns to step S40 and the processes in steps S40 and S50 are repeated until the value of switch number i becomes greater than the total number of switches N.

Currently, since the value of switch number i is "7" and the total number of switches N is "15", the judgment result will be "No", therefore, the process returns to step S40. In step S40, since the value of switch number i is "7", the control signal $C_7$ is set to "0" ($C_7$=0) and the switch 4 with switch number 7 (in FIG. 1, the seventh switch from the left side) is turned to the forward bias power source 5 side. Then the value of switch number i is incremented to "8". The judgment result in step S50 will still be "No" and the process returns to step S40.

After this, the same processes are repeated and the switches up to the switch 4 with switch number 15 (in FIG. 1, the sixth switch from the left side and all the switches after the sixth switch) are turned to the forward bias power source 5 side.

When the value of switch number i is incremented to "16" in step S40, the judgment result will be "Yes" in step S50. This completes the control to turn the switches 4 to the initial state.

Next, the control circuit 9 carries out an output power control.

Here, the control circuit 9 first carries out a stepwise output power control by the switching control of the switches 4 (bias direction control) and after roughly bringing the output power $P_{out}$ closer to the target output power value $P_{out,set}$, carries out a continuous output power control by the output voltage control of the forward bias power source 5 and carries out a fine-control such that the output power $P_{out}$ becomes equal to the target output power value $P_{out,set}$.

First, the control circuit 9 carries out a stepwise output power control by the switching control of the switches 4 (bias direction control) (steps S60 to S70).

Specifically, the control circuit 9 first judges whether the magnitude of the difference between the output power $P_{out}$ and the target output power value $P_{out,set}$ |$P_{out}-P_{out,set}$| is greater than a predetermined value $\Delta P_{out}$ (|$P_{out}-P_{out,set}$|>$\Delta P_{out}$) and the number of switches on the backward bias side $S_{cnt}$ is not less than "1" and not greater than "15" (15≧$S_{cnt}$≧1) (step S60). In this step, whether the sign of the difference between the output power $P_{out}$ and the target output power value $P_{out,set}$ is plus or minus is also judged.

When the result of judgment is that the magnitude of the difference between the output power $P_{out}$ and the target output power value $P_{out,set}$|$P_{out}-P_{out,set}$| is greater than the predetermined value $\Delta P_{out}$ (when the value of the output power $P_{out}$ is smaller and the sign of the difference is minus), and the number of switches on the backward bias side $S_{cnt}$ is equal to or greater than "1" "Yes", the process proceed to step S70.

Then, in step S70, the control circuit 9 sets the control signal $C_{Scnt}$ to "0" ($C_{Scnt}$=0). Here, since the number of switches on the backward bias side $S_{cnt}$ is "5", the control signal $C_5$ is set to "0" ($C_5$=0) and the switch 4 with switch number 5 (in FIG. 1, the fifth switch from the left side) is turned to the forward bias power source 5 side. Due to this the area of the amplification region 14A to which the forward bias is applied increases and the output power $P_{out}$ rises as a result.

In the switching pattern of the switches 4 set as described above (in the switching pattern in which the five leftmost switches are turned to the backward bias power source 6 side and the sixth switch and the switches after the sixth switch are turned to the forward bias power source 5 side), when the magnitude of the difference between the output power $P_{out}$ and the target output power value $P_{out,set}$|$P_{out}-P_{out,set}$| is greater than the predetermined value $\Delta P_{out}$ and the value of the output power $P_{out}$ is smaller, the output power control to raise the output power $P_{out}$ is carried out by turning one of the switches 4 directed to the backward bias power source 6 side to the forward bias power source 5 side to increase the area of the amplification region 14A to which the forward bias is applied.

Then, the control circuit 9 decrements the number of switches on the backward bias side $S_{cnt}$ ($S_{cnt}=S_{cnt}-1$) (step S70). As a result, the number of switches on the backward bias side $S_{cnt}$ becomes "4".

After this, the processes in steps S60 and S70 are repeated until the magnitude of the difference between the output power $P_{out}$ and the target output power value $P_{out,set}$|$P_{out}-P_{out,set}$| becomes equal to or less than the predetermined value $\Delta P_{out}$ or the number of switches on the backward bias side $S_{cnt}$ becomes smaller than "1".

On the other hand, when it is judged that the magnitude of the difference between the output power $P_{out}$ and the target output power value $P_{out,set}$|$P_{out}-P_{out,set}$| is greater than the predetermined value $\Delta P_{out}$ (when the value of the output power $P_{out}$ is greater and the sign of the difference is plus), and the number of switches on the backward bias side $S_{cnt}$ is equal to or less than "15" "Yes", the process proceeds to step S75.

Then, in step S75, the control circuit 9 sets the control signal $C_{Scnt+1}$ to "1" ($C_{Scnt+1}$=1). Here, since the number of switches on the backward bias side $C_{cnt}$ is "5", the control signal $C_6$ is set to "1" ($C_6$=1) and the switch 4 with switch number 6 (in FIG. 1, the sixth switch from the left side) is turned to the backward bias power source 6 side. Due to this, the area of the attenuation region 14B to which the backward bias is applied increases and the output power $P_{out}$ falls as a result.

In the switching pattern of the switches 4 set as described above (in the switching pattern in which the five leftmost switches are turned to the backward bias power source 6 side and the sixth switch and all the switches after the sixth switch are turned to the forward bias power source 5 side), when the magnitude of the difference between the output power $P_{out}$ and the target output power value $P_{out,set}|P_{out}-P_{out,set}|$ is greater than the predetermined value $\Delta P_{out}$ and the value of the output power $P_{out}$ is greater, the output power control to reduce the output power $P_{out}$ is carried out by turning one of the switches 4 directed to the forward bias power source 5 side to the backward bias power source 6 side to increase the area of the attenuation region 14B to which the backward bias is applied.

Then, the control circuit 9 increments the number of switches on the backward bias side $S_{cnt}$ ($S_{cnt}=S_{cnt}+1$) (step S75). As a result, the number of switches on the backward bias side $S_{cnt}$ becomes "6".

After this, the processes in steps S60 and S75 are repeated until the magnitude of the difference between the output power $P_{out}$ and the target output power value $P_{out,set}|P_{out}-P_{out,set}|$ becomes equal to or less than the predetermined value $\Delta P_{out}$ or the number of switches on the backward bias side $S_{cnt}$ becomes greater than "15".

When the number of switches on the backward bias side $S_{cnt}$ is decremented to "0" in step S70 or when the number of switches on the backward bias side $S_{cnt}$ is incremented to "16" in step S75, the judgment result in step S60 will be "No". This completes the output power control by the switching control of the switches 4 (bias direction control).

This is because when the number of switches on the backward bias side $S_{cnt}$ is decremented to "0", all of the switches 4 are turned to the forward bias power source 5 side and it is no longer possible to carry out the output power control by the switching control of the switches 4. On the other hand, when the number of switches on the backward bias side $S_{cnt}$ is incremented to "16", all of the switches 4 are turned to the backward bias power source 6 side and it is no longer possible to carry out the output power control by the switching control of the switches 4.

On the other hand, also when the magnitude of the difference between the output power $P_{out}$ and the target output power value $P_{out,set}|P_{out}-P_{out,set}|$ becomes equal to or less than the predetermined value $\Delta P_{out}$, the judgment result in step S60 will be "No". This completes the output power control by the switching control of the switches 4 (bias direction control).

In this manner, by carrying out the stepwise output power control by the switching control of the switches 4 (bias direction control), the output power $P_{out}$ is controlled stepwise and the difference between the output power $P_{out}$ and the target output power value $P_{out,set}|P_{out}-P_{out,set}|$ falls in a predetermined range and therefore the output power $P_{out}$ becomes closer to the target output power value $P_{out,set}$.

Next, the control circuit 9 carries out a continuous output power control by the output voltage control of the forward bias power source 5 (steps S80 to S120).

Specifically, the control circuit 9 first judges whether the output power $P_{out}$ is greater than the target output power value $P_{out,set}(P_{out}>P_{out,set})$ (step S80). When the result of judgment is that the output power $P_{out}$ is greater than the target output power value $P_{out,set}$ "Yes", the process proceeds to step S90.

Then, in step S90, the control circuit 9 subtracts a predetermined amount $\Delta V$ from the value of the forward bias voltage $V_f$ output from the forward bias power source 5 ($V_f = V_f - \Delta V$). At first, the value of the forward bias voltage $V_f$ output from the forward bias power source 5 is set to the initial value $V_{f,init}$, therefore, the predetermined amount $\Delta V$ is subtracted from the initial value $V_{f,init}$ as a result.

After this, the processes in steps S80 and S90 are repeated until the output power $P_{out}$ becomes equal to or less than the target output power value $P_{out,set}$.

When the output power $P_{out}$ becomes equal to or less than the target output power value $P_{out,set}$, the judgment result in step S80 will be "No". In this case, the process proceeds to step S100.

Then, the control circuit 9 judges whether the output power $P_{out}$ is less than the target output power value $P_{out,set}(P_{out}<P_{out,set})$ in step S100.

When the result of the judgment is that the output power $P_{out}$ is less than the target output power value $P_{out,set}$ "Yes", the process proceeds to step S110 and the control circuit 9 adds the predetermined amount $\Delta V$ to the value of the forward bias voltage $V_f$ output from the forward bias power source 5 ($V_f = V_f + \Delta V$).

Next, the control circuit 9 judges whether the value of the forward bias voltage $V_f$ set in step S110 is greater than the maximum output voltage $V_{f,max}$ of the forward bias power source 5 ($V_f > V_{f,max}$) (step S120). When the result of judgment is that the value of the forward bias voltage $V_f$ set in step S110 is equal to or less than the maximum output voltage $V_{f,max}$ of the forward bias power source 5 "No", the process returns to step S100 and the control circuit 9 again judges whether the output power $P_{out}$ is less than the target output power value $P_{out,set}(P_{out}<P_{out,set})$.

When the result of judgment is that the output power $P_{out}$ is less than the target output power value $P_{out,set}$ "Yes", the process proceeds to step S110 and the same process is repeated. On the other hand, when the result of judgment is that the output power $P_{out}$ is equal to or greater than the target output power value $P_{out,set}$ "No", the process returns to step S80 and the same process is repeated.

By the way, if it is judged that the output power $P_{out}$ is equal to the target output power value $P_{out,set}$ during the period of processes in step S80 to step S120, the output voltage control of the forward bias power source 5 is not carried out.

In this manner, by carrying out the output power control by the output voltage control of the forward bias power source 5, the output power $P_{out}$ is controlled continuously and a fine-control is carried out such that the output power $P_{out}$ becomes equal to the target output power value $P_{out,set}$.

After this, when the value of the forward bias voltage $V_f$ set in step S110 becomes greater than the maximum output voltage $V_{f,max}$ of the forward bias power source 5, the result of judgment by the control circuit 9 will be "Yes" in step S120. This completes the continuous output power control by the output voltage control of the forward bias power source 5. This is because when the value of the forward bias voltage $V_f$ set in step S110 becomes greater than the maximum output voltage $V_{f,max}$ of the forward bias power source 5, it is no longer possible to carry out the output power control by the output voltage control of the forward bias power source 5. In this case, the process returns to step S10 and the above-mentioned processes are repeated.

Here, since the initial value $S_{cnt,init}$ of the number of switches on the backward bias side $S_{cnt}$ is set to "5", both the control to increase the number of backward bias electrodes (step S75) and the control to reduce it (step S70) are carried out, however, either of the controls may be omitted by, for example, turning all the electrodes to the backward bias electrodes at first or turning all the electrodes to the forward bias electrodes.

Next, the automatic gain control (AGC) at the time of start-up of the semiconductor device according to the present embodiment is described with reference to the flow chart in FIG. 6. Here, a case where the bias voltages are switched as shown in FIG. 3 is described as an example.

Figure 6:
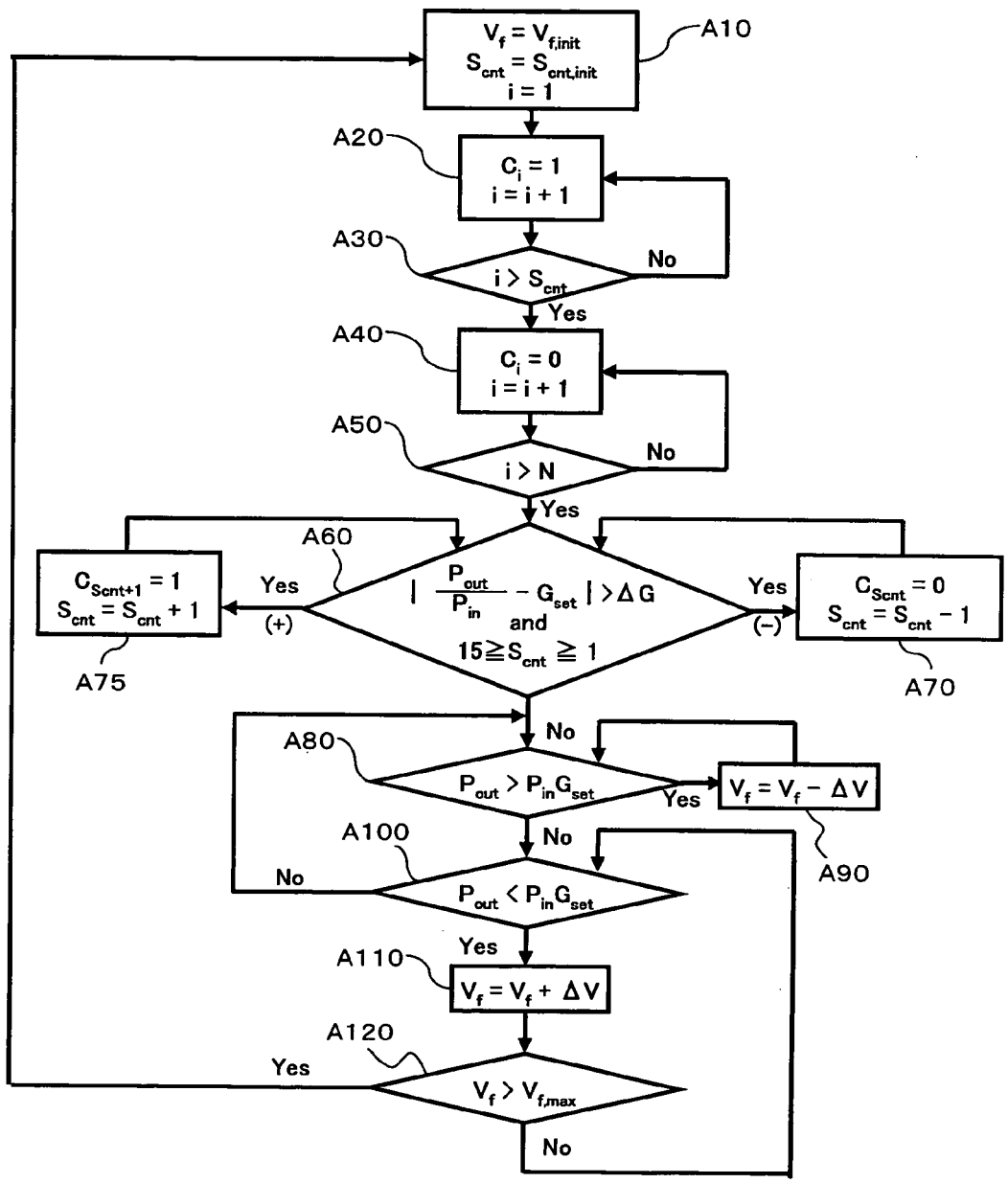
FIG. 6 is a flow chart for explaining an automatic gain control in a semiconductor device according to an embodiment of the present invention.

First, as shown in FIG. 6, the control circuit 9 carries out initialization (step A10). Specifically, this is the same as the case of the automatic power control described above (refer to step S10).

Next, the control circuit 9 carries out a control to turn the switches 4 to the initial state (steps A20 to A50). Specifically, this is the same as the case of the automatic power control described above (refer to steps S20 to S50)

Next, the control circuit 9 carries out a gain control.

Here, the control circuit 9 first carries out a stepwise gain control by the switching control of the switches 4 (bias direction control) and after roughly bringing an actual gain $P_{out}/P_{in}$ closer to the target gain value $G_{set}$, carries out a continuous gain control by the output voltage control of the forward bias power source 5 and carries out a fine-control such that the actual gain $P_{out}/P_{in}$ becomes equal to the target gain value $G_{set}$.

First the control circuit 9 carries out a stepwise gain control by the switching control of the switches 4 (bias direction control) (steps A60 to A70).

Specifically, the control circuit 9 first judges whether the magnitude of the difference between the actual gain $P_{out}/P_{in}$ and the target gain value $G_{set}|(P_{out}/P_{in})-G_{set}|$ is greater than a predetermined value $\Delta G$ ($|(P_{out}/P_{in})-G_{set}| > \Delta G$) and the number of switches on the backward bias side $S_{cnt}$ is not less than "1" and not greater than "15" ($15 \geq S_{cnt} \geq 1$) (step A60). In this step, whether the sign of the difference between the actual gain $P_{out}/P_{in}$ and the target gain value $G_{set}$ is plus or minus is also judged.

When the result of judgment is that the magnitude of the difference between the actual gain $P_{out}/P_{in}$ and the target gain value $G_{set}|(P_{out}/P_{in})-G_{set}|$ is greater than the predetermined value $\Delta G$ (when the value of the actual gain $P_{out}/P_{in}$ is smaller and the sign of the difference is minus) and the number of switches on the backward bias side $S_{cnt}$ is equal to or greater than "1" "Yes", the process proceeds to step A70.

Then, in step A70, the control circuit 9 sets the control signal $C_{Scnt}$ to "0" ($C_{Scnt}=0$). Here, since the number of switches on the backward bias side $S_{cnt}$ is "5", the control signal $C_5$ is set to "0" ($C_5=0$) and the switch 4 with switch number 5 (in FIG. 1, the fifth switch from the left side) is switched to the forward bias power source 5 side. Due to this, the area of the amplification region 14A to which the forward bias is applied increases and the actual gain $P_{out}/P_{in}$ rises as a result.

In the switching pattern of the switches 4 set as described above (in the switching pattern in which the five leftmost switches are turned to the backward bias power source 6 side and the sixth switch and the switches after the sixth switch are turned to the forward bias power source 5 side), when the magnitude of the difference between the actual gain $P_{out}/P_{in}$ and the target gain value $G_{set}|(P_{out}/P_{in})-G_{set}|$ is greater than the predetermined value $\Delta G$ and the value of the actual gain $P_{out}/P_{in}$ is smaller, the gain control to raise the actual gain $P_{out}/P_{in}$ is carried out by turning one of the switches 4 directed to the backward bias power source 6 side to the forward bias power source 5 side to increase the area of the amplification region 14A to which the forward bias is applied.

Then, the control circuit 9 decrements the number of switches on the backward bias side $S_{cnt}(S_{cnt}=S_{cnt}-1)$ (step A70). As a result, the number of switches on the backward bias side $C_{cnt}$ becomes "4".

After this, the processes in steps A60 and A70 are repeated until the magnitude of the difference between the actual gain $P_{out}/P_{in}$ and the target $G_{set}|(P_{out}/P_{in})-G_{set}|$ becomes equal to or less than the predetermined value $\Delta G$ or the number of switches on the backward bias side $S_{cnt}$ becomes smaller than "1".

On the other hand, when it is judged that that the magnitude of the difference between the actual gain $P_{out}/P_{in}$ and the target gain value $G_{set}|(P_{out}/P_{in})-G_{set}|$ is greater than the predetermined value $\Delta G$ (when the value of the actual gain $P_{out}/P_{in}$ is greater and the sign of the difference is plus), and the number of switches on the backward bias side $C_{cnt}$ is equal to or less than "15" "Yes", the process proceeds to step A75.

Then, in step A75, the control circuit 9 sets the control signal $C_{Scnt+1}$ to "1" ($C_{Scnt+1}$). Here, since the number of switches on the backward bias side $S_{cnt}$ is "5", the control signal $C_6$ is set to "1" ($C_6=1$) and the switch 4 with switch number 6 (in FIG. 1, the sixth switch from the left side) is turned to the backward bias power source 6 side. Due to this, the area of the attenuation region 14B to which the backward bias is applied increases and the actual gain $G_{set}$ falls as a result.

In the switching pattern of the switches 4 set as described above (in the switching pattern in which the five leftmost switches are turned to the backward bias power source 6 side and the sixth switch and the switches after the sixth switch are turned to the forward bias power source 5 side), when the magnitude of the difference between the actual gain $P_{out}/P_{in}$ and the target gain value $G_{set}|(P_{out}/P_{in})-G_{set}|$ is greater than the predetermined value $\Delta G$ and the value of the actual gain $P_{out}/P_{in}$ is greater, the gain control to reduce the actual gain $P_{out}/P_{in}$ is carried out by turning one of the switches 4 directed to the forward bias power source 5 side to the backward bias power source 6 side to increase the area of the attenuation region 14B to which the backward bias is applied.

Then, the control circuit 9 increments the number of switches on the backward bias side $S_{cnt}(S_{cnt}=S_{cnt}+1)$ (step A75). As a result, the number of switches on the backward bias side $S_{cnt}$ becomes "6".

After this, the processes in steps A60 and A75 are repeated until the magnitude of the difference between the actual gain $P_{out}/P_{in}$ and the target gain value $G_{set}|(P_{out}/P_{in})-G_{set}|$ becomes equal to or less than the predetermined value $\Delta G$ or the number of switches on the backward bias side $C_{cnt}$ becomes greater than "15".

When the number of switches on the backward bias side $C_{cnt}$ is decremented to "0" in step A70 or when the number of switches on the backward bias side $S_{cnt}$ is incremented to "16" in step A75, the judgment result in step A60 will be "No". This completes the gain control by the switching control of the switches 4 (bias direction control).

This is because when the number of switches on the backward bias side $S_{cnt}$ is decremented to "0", all of the switches 4 are turned to the forward bias power source 5 side and it is no longer possible to carry out the gain control by the switching control of the switches 4. On the other hand, when the number of switches on the backward bias side $S_{cnt}$ is incremented to "16", all of the switches 4 are turned to the backward bias power source 6 side and it is no longer possible to carry out the gain control by the switching control of the switches 4.

On the other hand, also when the magnitude of the difference between the actual gain $P_{out}/P_{in}$ and the target gain value $G_{set}|(P_{out}/P_{in})-G_{set}|$ becomes equal to or less than the predetermined value $\Delta G$, the judgment result in step A60 will be "No". This completes the gain control by the switching control of the switches 4 (bias direction control).

In this manner, by carrying out the stepwise gain control by the switching control of the switches 4 (bias direction control), the actual gain $P_{out}/P_{in}$ is controlled stepwise and the difference between the actual gain $P_{out}/P_{in}$ and the target gain value $G_{set}|(P_{out}/P_{in})-G_{set}|$ falls in a predetermined range and therefore the actual gain $P_{out}/P_{in}$ becomes closer to the target gain value $G_{set}$.

Next, the control circuit 9 carries out a continuous gain control by the output voltage control of the forward bias power source 5 (steps A80 to A120).

Specifically, the control circuit 9 first judges whether the actual gain $P_{out}/P_{in}$ is greater than the target gain value $G_{set}(P_{out}/P_{in}>G_{set})$ (step A80). When the result of judgment is that the actual gain $P_{out}/P_{in}$ is greater than the target gain value $G_{set}$ "Yes", the process proceeds to step A90.

Then, in step A90, the control circuit 9 subtracts a predetermined amount $\Delta V$ from the value of the forward bias voltage $V_f$ output from the forward bias power source 5 ($V_f = V_f - \Delta V$) At first, the value of the forward bias voltage $V_f$ output from the forward bias power source 5 is set to the initial value $V_{f,init}$, therefore, the predetermined amount $\Delta V$ is subtracted from the initial value $V_{f,init}$ as a result.

After this, the processes in steps A80 and A90 are repeated until the actual gain $P_{out}/P_{in}$ becomes equal to or less than the target gain value $G_{set}$.

When the actual gain $P_{out}/P_{in}$ becomes equal to or less than the target gain value $G_{set}$, the judgment result in step A80 will be "No". In this case, the process proceeds to step A100.

Then, the control circuit 9 judges whether the actual gain $P_{out}/P_{in}$ is less than the target gain value $G_{set}(P_{out}/P_{in}<G_{set})$ in step A100.

When the result of the judgment is that the actual gain $P_{out}/P_{in}$ is less than the target gain value $G_{set}$ "Yes", the process proceeds to step A110 and the control circuit 9 adds the predetermined amount $\Delta V$ to the value of the forward bias voltage $V_f$ output from the forward bias power source 5 ($V_f = V_f + \Delta V$).

Next, the control circuit 9 judges whether the value of the forward bias voltage $V_f$ set in step A110 is greater than the maximum output voltage $V_{f,max}$ of the forward bias power source 5 ($V_f > V_{f,max}$) (step A120). When the result of judgment is that the value of the forward bias voltage $V_f$ set in step A110 is equal to or less than the maximum output voltage $V_{f,max}$ of the forward bias power source 5 "No", the process returns to step A100 and the control circuit 9 again judges whether the actual gain $P_{out}/P_{in}$ is less than the target gain value $G_{set}(P_{out}/P_{in}<G_{set})$.

When the result of judgment is that the actual gain $P_{out}/P_{in}$ is less than the target gain value $G_{set}$ "Yes", the process proceeds to step A110 and the same process is repeated. On the other hand, when the result of judgment is that the actual gain $P_{out}/P_{in}$ is equal to or greater than the target gain value $G_{set}$ "No", the process returns to step A80 and the same process is repeated.

By the way, if it is judged that the actual gain $P_{out}/P_{in}$ is equal to the target gain value $G_{set}$ during the period of processes in step A80 to step A120, the output voltage control of the forward bias power source 5 is not carried out.

In this manner, by carrying out the gain control by the output voltage control of the forward bias power source 5, the actual gain $P_{out}/P_{in}$ is controlled continuously and a fine-control is carried out such that the actual gain $P_{out}/P_{in}$ becomes equal to the target gain value $G_{set}$.

After this, when the value of the forward bias voltage $V_f$ set in step A110 becomes greater than the maximum output voltage $V_{f,max}$ of the forward bias power source 5, the result of judgment by the control circuit 9 will be "Yes" in step A120. This completes the continuous gain control by the output voltage control of the forward bias power source 5. This is because when the value of the forward bias voltage $V_f$ set in step A110 becomes greater than the maximum output voltage $V_{f,max}$ of the forward bias power source 5, it is no longer possible to carry out the gain control by the output voltage control of the forward bias power source 5. In this case, the process returns to step A10 and the above-mentioned processes are repeated.

Here, since the initial value $S_{cnt, init}$ of the number of switches on the backward bias side $S_{cnt}$ is set to "5", both the control to increase the number of backward bias electrodes (step A75) and the control to reduce it (step A70) are carried out, however, either of the controls may be omitted by, for example, turning all the electrodes to the backward bias electrodes at first or turning all the electrodes to the forward bias electrodes.

Therefore, according to the semiconductor device of the present embodiment, an advantage is obtained that it becomes possible to integrate a semiconductor optical amplifier and devices used for an automatic gain control and an automatic power control and to carry out an automatic gain control and an automatic power control in accordance with the change in the power of input signal light without causing distortion in waveform and the deterioration of noise characteristic to occur.

In the above-mentioned embodiments, the switches 4 are connected to all of the p-side electrodes 2, however, this does not impose any limitation on the embodiments, and the switch 4 may be connected to at least one of the plural p-side electrodes 2.

Figure 7:
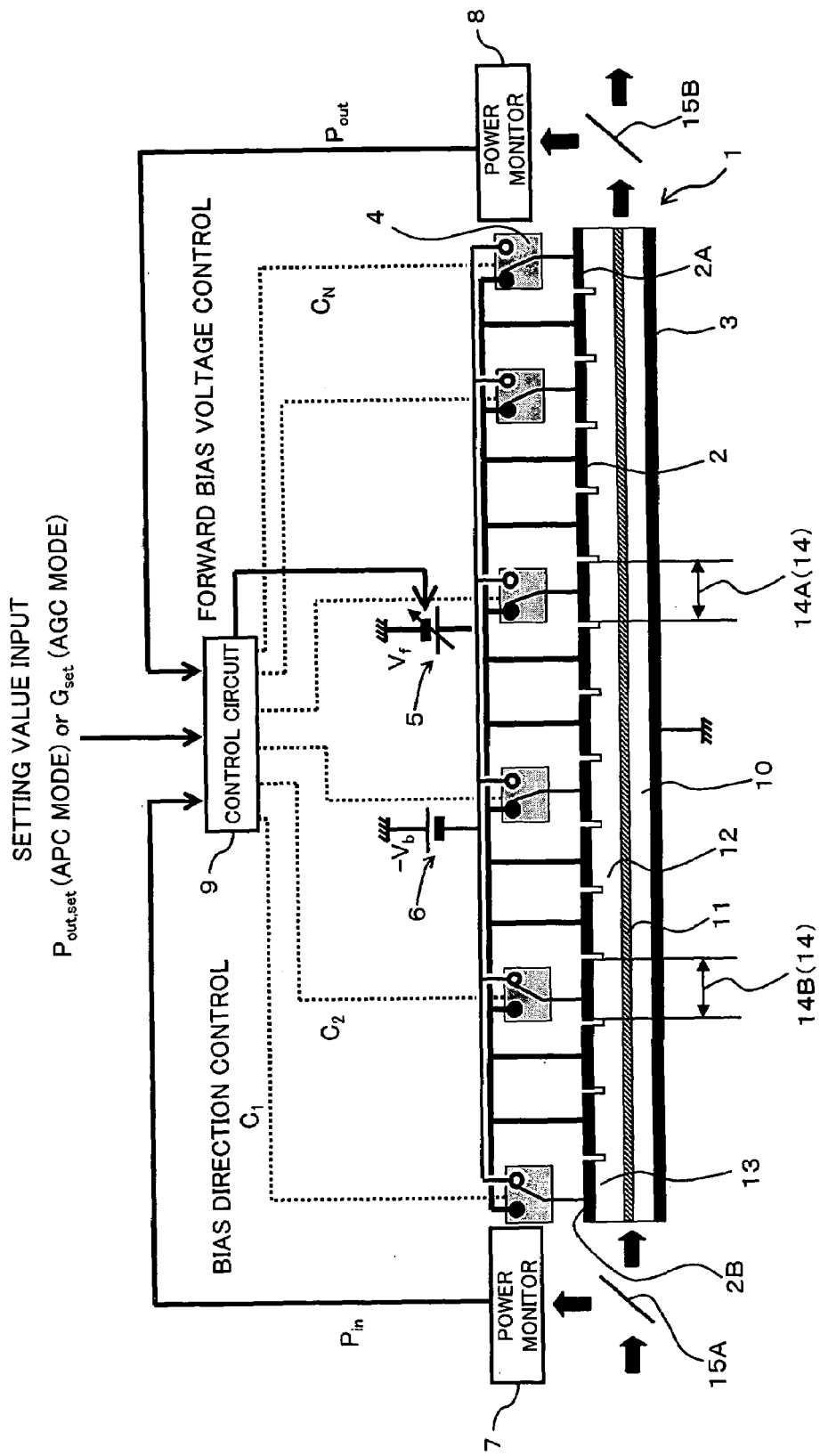
FIG. 7 is a schematic diagram showing a configuration of a modification example of a semiconductor device according to an embodiment of the present invention.
Figure 8:
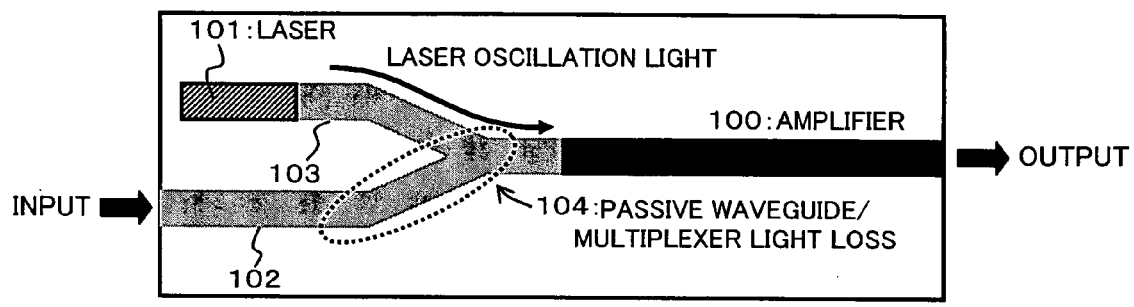
FIG. 8 is a schematic plan view for explaining a configuration example when automatic gain and power control mechanisms are integrated in a semiconductor optical amplifier.
Figure 9:
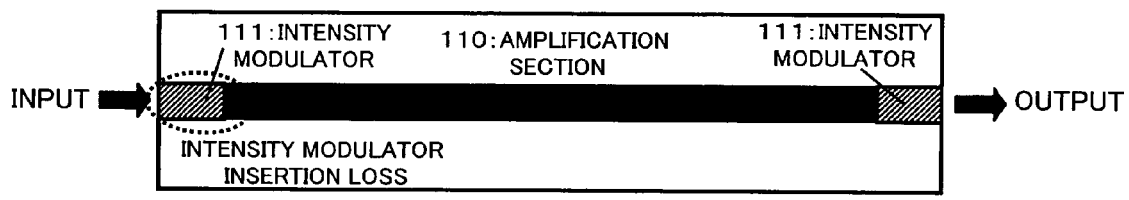
FIG. 9 is a schematic plan view for explaining a configuration example when automatic gain and power control mechanisms are integrated in a semiconductor optical amplifier.

For example, as shown in FIG. 7, it may be possible to provide the switches 4 only to a part of the p-side electrodes 2 and not provide the switches 4 to the rest of the p-side electrodes 2. Then, the p-side electrodes 2 not having the switch 4 are made to connect to the forward bias power source 5 directly. In this case, the forward bias voltage is applied to the p-side electrodes 2 not having the switch 4 at all times as a result. By the way, in FIG. 7, the same symbols are attached to the same components as those in FIG. 1.

In FIG. 7, two of the p-side electrodes 2 to which the switch 4 is not connected are arranged between the p-side electrodes 2 to which the switch 4 is connected, however, this does not impose any limitation on the embodiments, and the switches 4 may be connected to a part of the plural p-side electrodes 2. For example, the p-side electrodes 2 to which the switch 4 is not connected are each arranged between the p-side electrodes 2 to which the switch 4 is connected. Further, two or more of the p-side electrodes 2 to which the switch 4 is not connected may be arranged between the p-side electrodes 2 to which the switch 4 is connected. Furthermore, the p-side electrodes 2 to which the switch 4 is not connected may be arranged irregularly between the p-side electrodes 2 to which the switch 4 is connected.

In the above-mentioned embodiments, the common forward bias power source 5 and the common backward bias power source 6 are connected to all of the switches 4 and the same forward bias voltage or backward bias voltage is applied to all of the switches 4, but this does not impose any limitation on the embodiments. For example, the respective forward bias voltages applied to the respective plural electrodes may be different from each other. Similarly, the respective backward bias voltages applied to the respective plural electrodes may be different from each other. In order to realize this, it may be possible to connect a different forward bias power source or backward bias power source to each switch or connect a forward bias power source or backward bias power source to a part of switches and another forward bias power source or backward bias power source to the rest of the switches. Further, it may be possible to use a common forward bias power source or backward bias power source and provide a transformer circuit between the forward bias power source or the backward bias power source and the switch.

In the above-mentioned embodiments, both the automatic gain control and the automatic power control are carried out, but this does not impose any limitation on the embodiments, and either one of the controls may be carried out.

Further, in the above-mentioned embodiments, the p-side electrode 2 is used as a discrete electrode and the n-side electrode 3 is used as a common electrode, but this does not impose any limitation on the embodiments, and it may be possible to provide the plural n-side electrode 3 and use the n-side electrode 3 as a discrete electrode and the p-side electrode 2 as a common electrode. It is needless to say that the semiconductor stacking body 1 may be formed on the n type semiconductor substrate or on the p type semiconductor substrate.

The present invention is not limited by the above-mentioned embodiments and various modifications are possible without departing from the concept and scope of the present invention.

What is claimed is:

1. A semiconductor device comprising:
    a semiconductor stacking body configured so as to sandwich an active layer between a p-type semiconductor layer and an n-type semiconductor layer and having a plurality of regions along said active layer;
    a plurality of electrodes provided on said p-type semiconductor layer or said n-type semiconductor layer, each electrode being provided for a corresponding one of said plurality of regions; and
    one or more switches, each operatively connected to at least one of said plurality of electrodes configured for switching bias voltage application directions;
    wherein the semiconductor device is configured so that when a said switch is set to a first state, each of said plurality of regions corresponding to said at least one of the plurality of electrodes is forward biased by a voltage applied via said at least one electrode and becomes an amplification region, and, when the said switch is set to a second state, is backward biased by a voltage applied via said at least one electrode and becomes an attenuation region;
    a variable forward bias power source to be connected to said electrodes via said switches;
    a fixed backward bias power source to be connected to said electrode via said switch; and
    a control circuit carrying out a switching control of said one or more switches and a control of an output voltage of said variable forward bias power source to control an output power or a gain.

2. The semiconductor device according to claim 1, comprising:
    an output power monitor for monitoring the power of output light;
    wherein said control circuit carries out the switching control of said one or more switches and the control of an output voltage of said variable forward bias power source to control the output power based on the light power monitored by said output power monitor.

3. The semiconductor device according to claim 2, wherein said control circuit carries out the switching control of said one or more switches such that the output power monitored by said output power monitor change in a stepwise manner.

4. The semiconductor device according to claim 2 or 3, wherein said control circuit carries out the control of an output voltage of said variable forward bias power source such that the output power monitored by said output power monitor change continuously.

5. The semiconductor device according to claim 2, wherein said control circuit carries out switching control of said switch when the difference between the output power monitored by said output power monitor and a target output power value is greater than a predetermined value, and carries out the output voltage control of said variable forward bias power source when the difference between said output power and said target output power value is equal to or less than the predetermined value.

6. The semiconductor device according to claim 1, comprising:
    a power monitor for monitoring light power;
    wherein said control circuit carries out the switching control of said one or more switches and the control of an output voltage of said variable forwarded bias power source to control the gain based on the light power monitored by said power monitor.

7. The semiconductor device according to claim 6, wherein said control circuit carries out the switching control of said switches such that an actual gain obtained based on the light power monitored by said power monitor change in a stepwise manner.

8. The semiconductor device according to claim 6 or 7, wherein said control circuit carries out the output voltage control of said variable forward bias power source such that an actual gain obtained based on the light power monitored by said power monitor change continuously.

9. The semiconductor device according to claim 6, wherein said control circuit carries out the switching control of said switch when the difference between an actual gain obtained based on the light power monitored by said power monitor and a target gain value is greater than a predetermined value, and carries out the output voltage control of said variable forward bias power source when the difference between said actual gain and said target gain value is equal to or less than the predetermined value.

10. The semiconductor device according to claim 1, wherein:
    said switch is connected to an electrode provided in the region nearest to the input end of said semiconductor stacking body;
    an input power monitor for monitoring the power of input light;

wherein said control circuit carries out the control to switch said switch to said one side such that the region nearest to the input end of said semiconductor stacking body functions as an amplifier when the input power monitored by said input power monitor is less than a predetermined value.

11. The semiconductor device according to claim 1, comprising plural switches as said switch, wherein said plural switches are connected respectively one to each of said plural electrodes.

12. The semiconductor device according to claim 11, wherein said plural switches are alternately switched to the forward and backward sides.

13. The semiconductor device according to claim 1, comprising plural switches as said switch, wherein said plural switches are connected to a part of said plural electrodes.

14. The semiconductor device according to claim 1, wherein a forward bias voltage to be applied to each of said plural electrodes is different from each other.

15. The semiconductor device according to claim 1, wherein a backward bias voltage to be applied to each of said plural electrodes is different from each other.

* * * * *

UNITED STATES PATENT AND TRADEMARK OFFICE
CERTIFICATE OF CORRECTION

PATENT NO. : 7,280,272 B2
APPLICATION NO. : 11/230629
DATED : October 9, 2007
INVENTOR(S) : Tomoyuki Akiyama It is certified that error appears in the above-identified patent and that said Letters Patent is hereby corrected as shown below:

On the Title page:

Item "(54)" BIAS CONTROL OF SOA VIA SWITCHES"

should read:

Item -- (54) SEMICONDUCTOR DEVICE--

Signed and Sealed this

Eighteenth Day of December, 2007

JON W. DUDAS
*Director of the United States Patent and Trademark Office*